(12) United States Patent
Kwon et al.

(10) Patent No.: US 6,391,659 B1
(45) Date of Patent: *May 21, 2002

(54) METHODS FOR FABRICATING FERROELECTRIC MEMORY DEVICES USING PULSED-POWER PLASMA

(75) Inventors: O-Sung Kwon; Chang-Ju Choi, both of Kyoungki-Do (KR)

(73) Assignee: Hyundai Electronics Industries Co., Ltd. (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/569,069

(22) Filed: May 10, 2000

(30) Foreign Application Priority Data

Jun. 30, 1999 (KR) .......................... 1999-25865

(51) Int. Cl.⁷ ............................... H01L 21/00
(52) U.S. Cl. ............................ 438/3; 438/239
(58) Field of Search ................ 438/3, 239, 240, 438/253, 396, 254, 255, 397, 398

(56) References Cited

U.S. PATENT DOCUMENTS 5,849,043 A  * 12/1998 Zhang et al. ............... 29/25.01
6,114,199 A  *  9/2000 Isobe et al. ................. 438/240

* cited by examiner

Primary Examiner—Viet Q. Nguyen
Assistant Examiner—David Nhu
(74) Attorney, Agent, or Firm—Blakely Sokoloff Taylor & Zafman

(57) ABSTRACT

There is provided a method for fabricating a ferroelectric memory device, which can prevent the deterioration of the ferroelectric characteristics from etching damage generated during etching process of the interlayer-insulating layer formed over the capacitor to form a contact hole. The present invention is characterized by etching the interlayer-insulating layer with the use of time-modulated plasma, namely pulsed-power plasma. Accordingly, the present invention can prevent the deterioration of the ferroelectric characteristics from etching, omit or reduce the later separate thermal process for recovering the etching damage and enhance the reliability of device.

10 Claims, 4 Drawing Sheets

METHODS FOR FABRICATING FERROELECTRIC MEMORY DEVICES USING PULSED-POWER PLASMA

FIELD OF THE INVENTION

The present invention relates to fabrication methods of semiconductor memory devices; and, more particularly, to fabrication methods of ferroelectric memory devices, which can reduce the damage from plasma etching by using a pulsed-power technique.

DESCRIPTION OF THE PRIOR ART

By using ferroelectric material into capacitors in semiconductor memory devices, there have been proceeded the developments of the devices which can overcome the limitation of refresh present in the conventional DRAM (Dynamic Random Access Memory) devices and have large capacitance of memory. FeRAM (ferroelectric random access memory) devices as non-volatile memory devices can store information even at the condition of power off and also are equitable in operating speed to the conventional DRAM. So, they are promising as a future generation of storage devices.

Thin films of $SrBi_2Ta_2O_9$ (hereinafter, referred as SBT) and $Pb(Zr,Ti)O_3$ (hereinafter, referred as PZT) are mainly used as capacitance material in FeRAM devices. The ferroelectric materials have hundreds or thousands of dielectric constant at room temperature and two stable remanent polarization states. So, they are applied to the practices of nonvolatile memory devices with the states of thin films. The nonvolatile device with the ferroelectric thin film uses the principle that if an electric field is applied to the device to adjust the orientation of polarization and to input a signal, then the orientation of remanent polarization remained when the electric field is removed makes the digital signal 1 or 0 be stored in the device.

After completed with the formation of a capacitor comprising of a bottom electrode, a ferroelectric thin film and a top electrode, an oxide layer for interlayer insulating is formed over the entire structure and selectively dry-etched to form contact holes exposing the top electrode and the bottom electrode.

In the conventional fabrication method of FeRAM device, the dry etching is performed with plasma generated by RF (radio frequency) or micro power of hundreds kHz or several GHz. This method necessarily induces electrical or physical damage in the device.

In case of DRAM, the etching damage from plasma may be recovered in any later thermal process, so it does not result in problems. However, in case of FeRAM using ferroelectric material such as SBT, the ferroelectric characteristics may be easily deteriorated with the plasma. This deterioration results in decreasing the reading and writing performances of FeRAM and reducing the lifetime of the device. Thus, a separate thermal treatment for recovering the ferroelectric characteristics should be performed at about 700° C. for about 30 minutes.

Accordingly, there are required process developments, which can reduce the damage of ferroelectric layer generated during dry etching with plasma for the oxide layer covered over the capacitor.

SUMMARY OF THE INVENTION

It is, therefore, an object of the present invention to provide a method for fabricating ferroelectric memory devices, which can prevent the deterioration of ferroelectric characteristics generated from conventional dry etching with continuous wave plasma for interlayer-insulating layer for forming capacitor contact.

In accordance with an embodiment of the present invention, there is provided a method for fabricating a ferroelectric memory device, which comprises the steps of forming an interlayer-insulating layer over the entire structure completed with the formation of a ferroelectric capacitor including a bottom electrode, a ferroelectric layer and a top electrode; and selectively etching the interlayer-insulating layer with pulsed-power plasma to form a contact hole exposing the top electrode of capacitor.

In accordance with another embodiment of the present invention, there is provided a method for fabricating a ferroelectric memory device, which comprises the steps of forming a first interlayer-insulating layer over the entire structure completed with the formation of transistor; forming a capacitor which includes a bottom electrode, a ferroelectric layer and a top electrode and in which the ferroelectric layer and the top electrode are superimposed on a part of the bottom electrode; forming a second interlayer-insulating layer over the ferroelectric capacitor; and selectively etching the second interlayer-insulating layer with pulsed-power plasma to form a contact hole exposing the top electrode of capacitor.

The present invention is characterized in that the interlayer-insulating layer covering the capacitor is etched with time modulated plasma, namely pulsed-power plasma. The pulsed-power plasma has lower electron temperature and ion energy within the plasma than the conventional continuous wave plasma. This is because high energetic electrons in the plasma are cooled during plasma off-period when the main power is adjusted with several decades microseconds.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

The pulsed-power plasma as used herein means the plasma generated by using pulsed-power inductively coupled plasma technique with time modulation.

The electrical damage suppression method in ferroelectric capacitor contact etching is also described in a document entitled with "Electrical Damage Suppression Using a Pulsed-Power Inductively Coupled Plasma in Ferroelectric Capacitor Contact Etching" published by the inventors on May 10, 1999 at 1999 4$^{th}$ International Symposium on Plasma Process-Induced Damage, which correlates with the present invention and is incorporated herein by reference.

The invention will be illustrated in detail by the following preferred embodiments with reference to the accompanying drawings.

Figure 1:
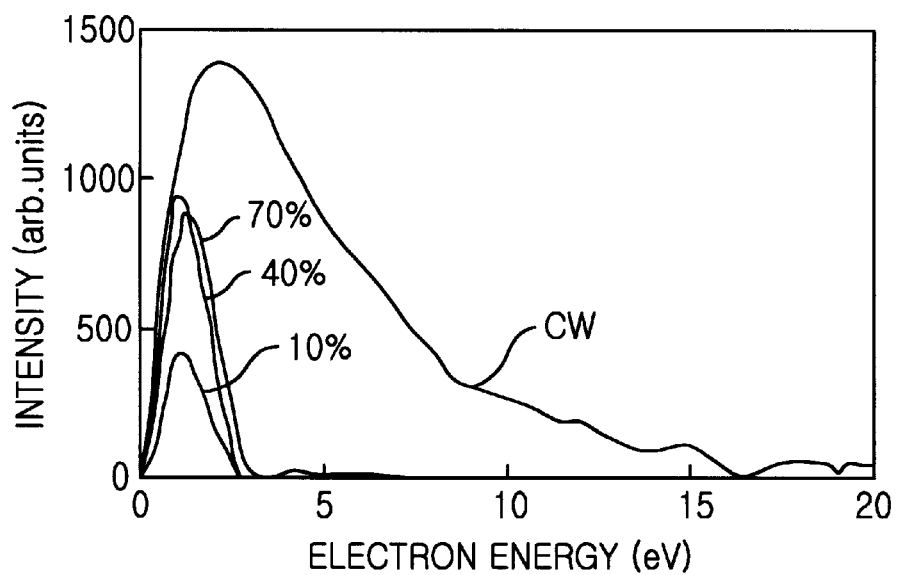
FIG. 1 is a graph showing electron energy distribution functions of pulsed-power plasma at some duty ratios, compared with electron energy distribution function of continuous wave plasma.

FIG. 1 is a graph showing electron energy distribution functions of pulsed-power plasma at some duty ratios, compared with electron energy distribution function of continuous wave plasma. The duty ratio means the ratio of voltage inputting time for forming pulsed-power plasma among entire plasma generating time.

Figure 2:
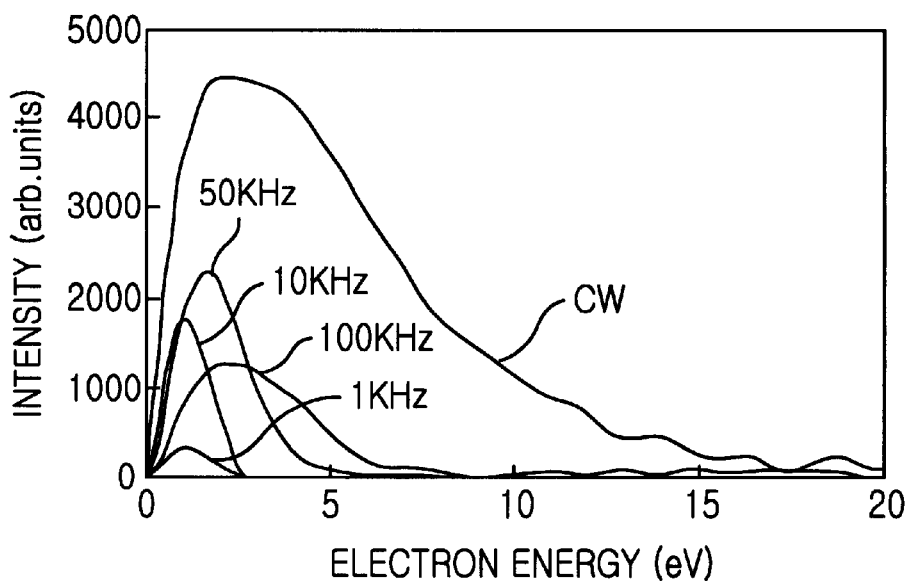
FIG. 2 is a graph showing electron energy distribution functions of pulsed-power plasma at some modulation frequencies, compared with that of continuous wave plasma.

FIG. 2 is a graph showing electron energy distribution functions of pulsed-power plasma at some modulation frequencies, compared with that of continuous wave plasma.

As shown in the results of FIGS. 1 and 2, the pulsed-power plasma can generate the less etching damage than the continuous wave (CW) plasma.

Figure 3:
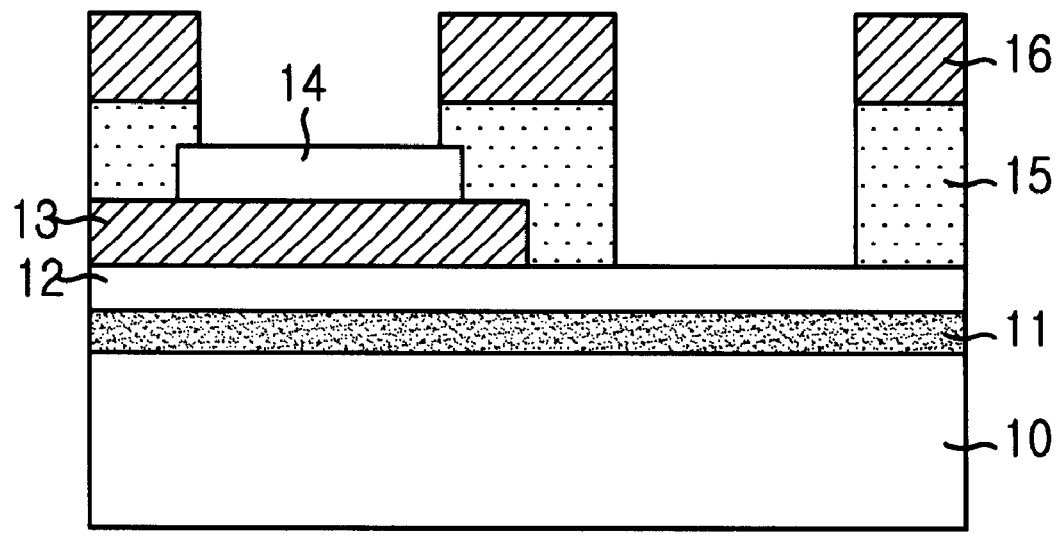
FIG. 3 is a cross-sectional view showing the fabrication processes for the ferroelectric memory device in accordance with one embodiment of the present invention.

FIG. 3 shows a fabrication method of a ferroelectric memory device in accordance with one embodiment of the present invention.

First, a first interlayer-insulating layer 11 is formed with $SiO_2$ or the like over a semiconductor substrate (not shown) completed with the formation of transistor and the others (not shown). Then, a Pt bottom electrode 12, an SBT layer 13 and a Pt top electrode 14 are, in turn, formed on the first interlayer-insulating layer 11. At this time, the SBT layer 13 and the Pt top electrode 14 are superimposed on a part of the Pt bottom electrode 12.

Subsequently, a second interlayer-insulating layer 15 with $SiO_2$ or the like is formed with a thickness of about 5500 Å over the entire structure. A photoresist pattern 16 to define the region of contact hole is then formed on the second interlayer-insulating layer 15. The second interlayer-insulating layer is then selectively etched with pulsed-power plasma using the photoresist pattern 16 as an etching mask to form contact holes exposing the Pt top electrode 14 and the Pt bottom electrode 12.

At this time, the etching is performed with the conditions of a source power of 800 W, a bias power of 600 W, a pressure of 5 mTorr, a temperature of 40° C., a $CF_4$ flow rate of 15 sccm, and an Ar flow rate of 15 sccm. The frequency for generating the pulsed-power plasma may range from 1 kHz to 100 kHz.

Later, metal wires (not shown) are formed to connect with the Pt top electrode 14 and the Pt bottom electrode 12, respectively.

Meanwhile, though the above-described embodiment explains the present invention with an example of exposing all of the top and bottom electrodes, the present invention may be applied to the process to expose only the top electrode.

Figure 4:
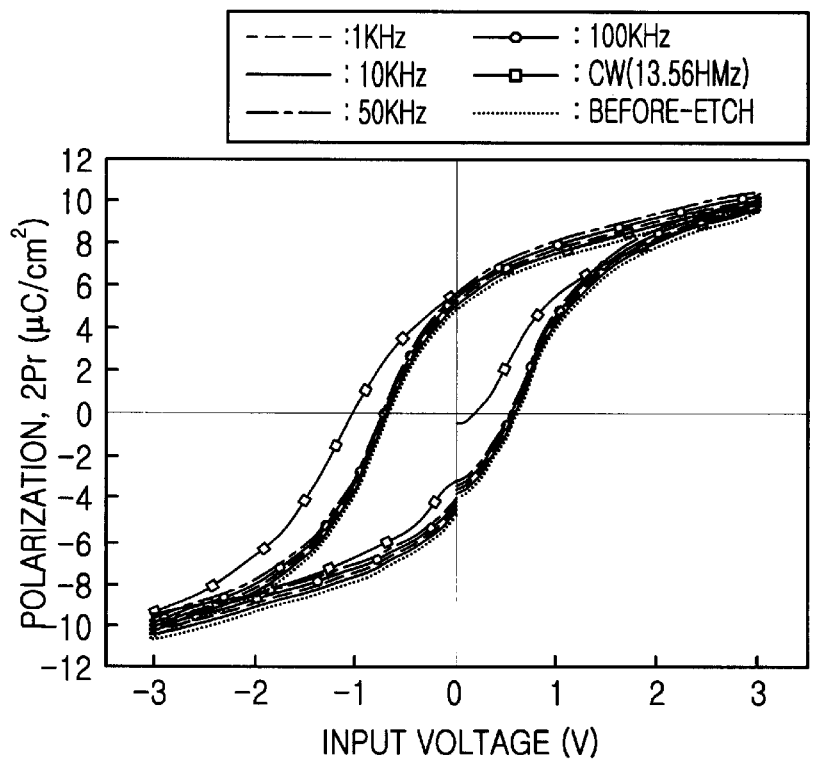
FIG. 4 is a graph showing the ferroelectric polarization characteristics with input voltage at some modulation frequencies for generating the pulsed-power plasma.

FIG. 4 is a graph showing the ferroelectric polarization characteristics with input voltage at some modulation frequencies for generating the pulsed-power plasma. The ferroelectric characteristics such as remanent polarization 2Pr and coercive voltage Vc at the pulsed-power mode is not changed from the values of initial capacitor. On the other hand, the hysteresis loop after CW contact etching is degraded greatly in term of polarization and coercive voltage.

Figure 5:
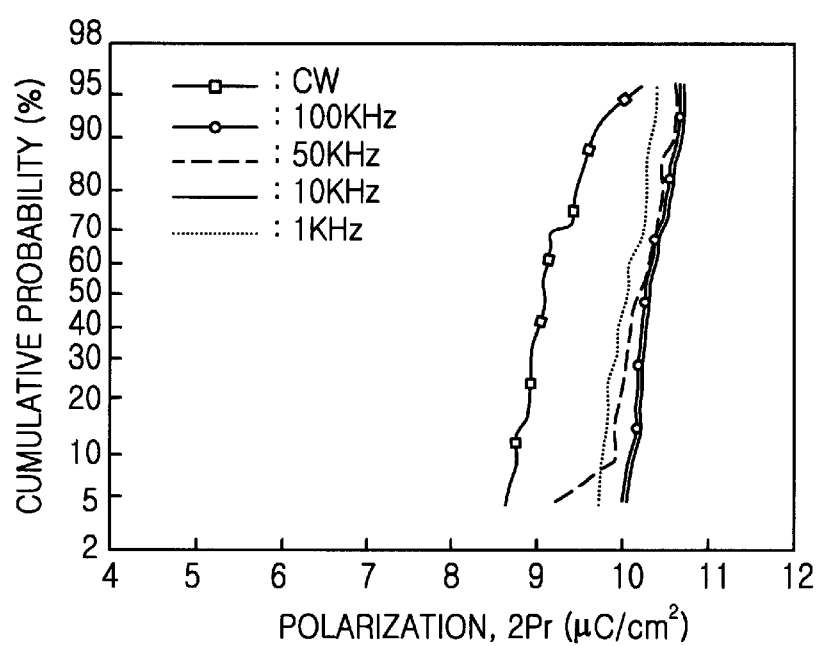
FIG. 5 is a graph showing the cumulative possibility characteristics with the ferroelectric polarization at some modulation frequencies for generating the pulsed-power plasma.

FIG. 5 is a graph showing the cumulative possibility characteristics with the ferroelectric polarization at some modulation frequencies for generating the pulsed-power plasma. As shown in FIG. 5, when the cumulative possibility is 50%, while the value of 2Pr is about 9.2 $\mu C/cm^2$ in case of continuous wave (CW) plasma, the value of 2Pr in case of pulsed-power plasma is about 10.2 $\mu C/cm^2$ with regardless of frequency. Accordingly, when the etching is performed with the input of the pulsed-power plasma, the value of 2Pr is less decreased by about 1 $\mu C/cm^2$.

Figure 6:
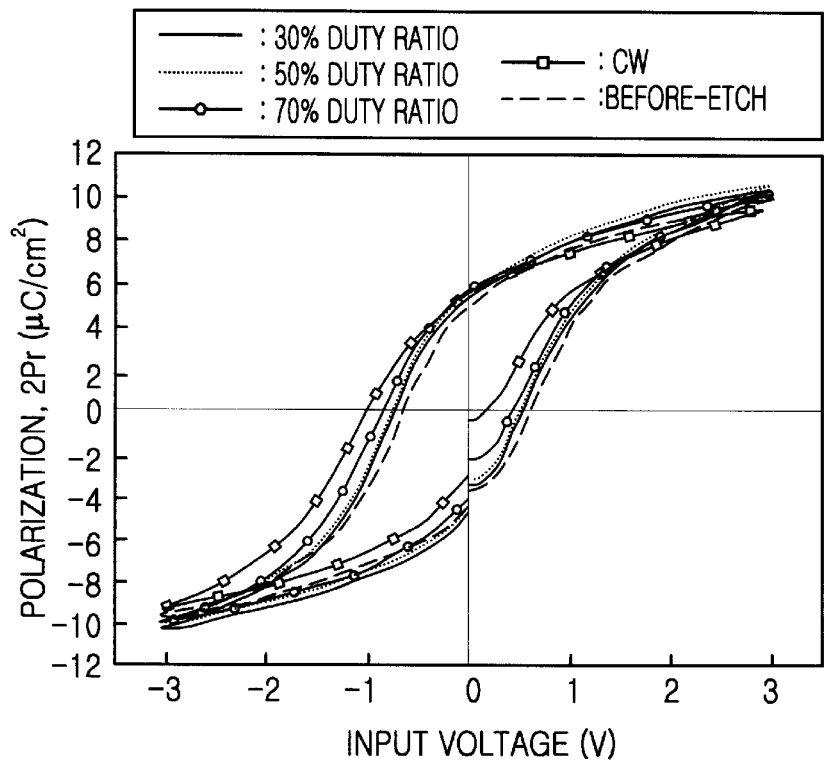
FIG. 6 is a graph showing the ferroelectric polarization characteristics with the input voltage at some duty ratios for generating pulsed-power plasma.

FIG. 6 is a graph showing the ferroelectric polarization characteristics with the input voltage at some duty ratios for generating pulsed-power plasma. The ferroelectric characteristics such as remanent polarization 2Pr and coercive voltage Vc at the pulsed-power mode is not changed from the values of initial capacitor. On the other hand, the hysteresis loop after CW contact etching is degraded greatly in term of polarization and coercive voltage.

Figure 7:
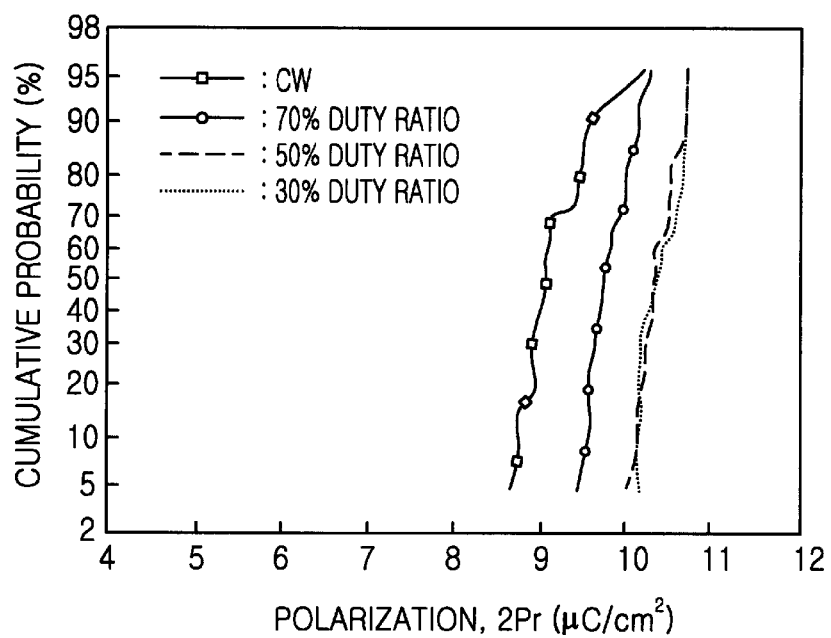
FIG. 7 is a graph showing the cumulative possibility characteristics with the ferroelectric polarization at some duty ratios for generating the pulsed-power plasma.

FIG. 7 is a graph showing the cumulative possibility characteristics with the ferroelectric polarization at some duty ratios for generating the pulsed-power plasma. As shown in FIG. 7, when the cumulative possibility is 50%, while the value of 2Pr is about 9.2 $\mu C/cm^2$ in case of continuous wave (CW) plasma, the value of 2Pr in case of pulsed-power plasma is about 10.4 $\mu C/cm^2$ with regardless of frequency. Accordingly, when the etching is performed with the input of the pulsed-power plasma, the value of 2Pr is less decreased by about 1.2 $\mu C/cm^2$.

The present invention is to etch the interlayer-insulating layer over the capacitor by using the pulsed-power plasma compared with the conventional continuous wave plasma. Accordingly, the present invention can reduce the etching damage of the ferroelectric layer with regardless of process window in consideration of the plasma properties. According to this, the present invention can prevent the deterioration of the ferroelectric characteristics from etching, omit or reduce the later separate thermal process for recovering the etching damage and enhance the reliability of device.

While the present invention has been described with respect to certain preferred embodiments only, other modifications and variations may be made without departing from the spirit and scope of the present invention as set forth in the following claims.

What is claimed is:

1. A method for fabricating a ferroelectric memory device, which comprises the steps of:
    forming a ferroelectric capacitor on a semiconductor substrate, wherein the ferroelectric capacitor includes a bottom electrode, a top electrode and a ferroelectric layer between the bottom electrode and the top electrode;
    forming an interlayer-insulating layer covering the ferroelectric capacitor, wherein a bottom surface of the interlayer-insulating layer is contacted to the top electrode of the ferroelectric capacitor; and
    selectively etching the interlayer-insulating layer with pulsed-power plasma to form a contact hole exposing the top electrode of the ferroelectric capacitor.

2. The method according to claim 1, further comprising the step of forming wire connected with the top electrode of the ferroelectric capacitor.

3. The method according to claim 1, wherein the interlayer-insulating layer is formed with silicon oxide.

4. The method according to claim 3, wherein the step of etching is performed with the conditions of a source power of about 800 W, a bias power of about 600 W, a pressure of about 5 mTorr, a temperature of about 40° C., a $CF_4$ flow rate of about 15 sccm and an Ar flow rate of about 15 sccm.

5. The method according to claim 4, wherein the step of etching is performed with a frequency ranging form about 1 kHz to about 100 kHz.

6. A method for fabricating a ferroelectric memory device, which comprises the steps of:

forming a transistor on a semiconductor substrate;

forming a first interlayer-insulating layer covering a transistor;

forming a ferroelectric capacitor on the first interlayer-insulating layer, wherein the ferroelectric capacitor includes a bottom electrode, a top electrode and a ferroelectric layer between the bottom electrode and the top electrode;

forming a second interlayer-insulating layer covering the ferroelectric capacitor, wherein a bottom surface of the second interlayer-insulating layer is contacted to the top electrode of the ferroelectric capacitor; and selectively etching the second interlayer-insulating layer with pulsed-power plasma to form a contact hole exposing the top electrode of the ferroelectric capacitor.

7. The method according to claim 6, further comprising the step of forming wire connected with the top electrode of the ferroelectric capacitor.

8. The method according to claim 6, wherein the interlayer-insulating layer is formed with silicon oxide.

9. The method according to claim 8, wherein the step of etching is performed with the conditions of a source power of about 800 W, a bias power of about 600 W, a pressure of about 5 mTorr, a temperature of about 40° C., a $CF_4$ flow rate of about 15 sccm and an Ar flow rate of about 15 sccm.

10. The method according to claim 9, wherein the step of etching is performed with a frequency ranging form about 1 kHz to about 100 kHz.

\* \* \* \* \*